(12) United States Patent
Casatuta et al.

(10) Patent No.: US 10,768,230 B2
(45) Date of Patent: Sep. 8, 2020

(54) BUILT-IN DEVICE TESTING OF INTEGRATED CIRCUITS

(71) Applicant: International Business Machines Corporation, Armonk, NY (US)

(72) Inventors: Robert M. Casatuta, Wappingers Falls, NY (US); Mary P. Kusko, Hopewell Junction, NY (US); Gary W. Maier, Poughkeepsie, NY (US); Franco Motika, Hopewell Junction, NY (US); Phong T. Tran, Highland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 447 days.

(21) Appl. No.: 15/166,578

(22) Filed: May 27, 2016

(65) Prior Publication Data
US 2017/0343601 A1  Nov. 30, 2017

(51) Int. Cl.
*G01R 31/317* (2006.01)
*G01R 31/28* (2006.01)
(Continued)

(52) U.S. Cl.
CPC . *G01R 31/31724* (2013.01); *G01R 31/31707* (2013.01); *G01R 31/2834* (2013.01); *G01R 31/2851* (2013.01); *G01R 31/319* (2013.01); *G01R 31/3177* (2013.01); *G01R 31/3183* (2013.01); *G01R 31/3187* (2013.01);
(Continued)

(58) Field of Classification Search
CPC ........ G01R 31/31707; G01R 31/31724; G01R 31/3177; G01R 31/31725; G01R 31/2834; G01R 31/2851; G01R 31/3187; G01R 31/319; G01R 31/31901; G01R 31/31727; G01R 31/3183; G01R 31/318569; G01R 31/318594; G01R 31/31937; G06F 11/27; G06F 11/00; G06F 11/3672;
(Continued)

(56) References Cited

U.S. PATENT DOCUMENTS 5,951,705 A * 9/1999 Arkin ............... G01R 31/31907
714/738
7,315,969 B2 1/2008 Jakobs
(Continued)

FOREIGN PATENT DOCUMENTS

WO 2009059172 A2 5/2009

*Primary Examiner* — April Y Blair
*Assistant Examiner* — Sazzad Hossain
(74) *Attorney, Agent, or Firm* — Cantor Colburn LLP; Erik Johnson

(57) ABSTRACT

Embodiments are directed to a computer implemented method and system for the testing, characterization and diagnostics of integrated circuits. A system might include a device under test, such as an integrated circuit, that includes an adaptive microcontroller. The method includes loading a testing program for execution by the adaptive microcontroller, causing the microcontroller to execute the testing program. Once results from the testing program are received, the testing program can be adaptively modified based on the results. The modified testing program can be run again. The testing program can modify parameters of the integrated circuit that are not externally accessible. Other embodiments are also disclosed.

17 Claims, 6 Drawing Sheets

(51) Int. Cl.

| | | |
|---|---|---|
| G01R 31/319 | (2006.01) | |
| G06F 11/27 | (2006.01) | |
| G06F 11/36 | (2006.01) | |
| G11C 29/56 | (2006.01) | |
| G11C 29/44 | (2006.01) | |
| G01R 31/3183 | (2006.01) | |
| G01R 31/3177 | (2006.01) | |
| G01R 31/3185 | (2006.01) | |
| G11C 29/12 | (2006.01) | |
| G01R 31/3187 | (2006.01) | |
| G06F 11/00 | (2006.01) | |

(52) U.S. Cl.
CPC .. *G01R 31/31725* (2013.01); *G01R 31/31727* (2013.01); *G01R 31/31901* (2013.01); *G01R 31/318569* (2013.01); *G01R 31/318594* (2013.01); *G06F 11/00* (2013.01); *G06F 11/27* (2013.01); *G06F 11/3672* (2013.01); *G06F 11/3692* (2013.01); *G11C 29/12* (2013.01); *G11C 29/4401* (2013.01); *G11C 29/56008* (2013.01); *G11C 2029/4402* (2013.01)

(58) Field of Classification Search
CPC ................. G06F 11/3692; G11C 29/12; G11C 2029/4402; G11C 29/4401; G11C 29/56008
See application file for complete search history.

(56) References Cited

U.S. PATENT DOCUMENTS

| | | | |
|---|---|---|---|
| 7,475,312 | B2 | 1/2009 | Van Kaam |
| 7,483,429 | B2 | 1/2009 | Calvignac et al. |
| 7,519,878 | B2 | 4/2009 | Rosen |
| 7,821,816 | B2 | 10/2010 | Deng et al. |
| 7,882,407 | B2 | 2/2011 | Abu-Rahma et al. |
| 8,161,431 | B2 | 4/2012 | Buonpane et al. |
| 8,169,844 | B2 | 5/2012 | Azimi et al. |
| 8,694,276 | B2 | 4/2014 | Sontakke et al. |
| 9,081,063 | B2 | 7/2015 | Narayanan et al. |
| 9,244,756 | B1 | 1/2016 | Forlenza et al. |
| 2006/0155500 | A1* | 7/2006 | Van Kaam ......... G01R 31/3187 702/117 |
| 2006/0290365 | A1* | 12/2006 | Riedlinger ......... G01R 31/2856 324/750.03 |
| 2008/0034262 | A1* | 2/2008 | Whetsel ......... G01R 31/318555 714/729 |
| 2009/0070644 | A1* | 3/2009 | Markle ............ G01R 31/31707 714/724 |
| 2012/0230136 | A1* | 9/2012 | Gorman ............. G11C 29/4401 365/200 |
| 2013/0152048 | A1* | 6/2013 | Sato .................... G06F 11/2236 717/124 |
| 2015/0304177 | A1 | 10/2015 | Greathouse et al. |
| 2016/0011259 | A1 | 1/2016 | Litovchenko et al. |

* cited by examiner

BUILT-IN DEVICE TESTING OF INTEGRATED CIRCUITS

BACKGROUND

The present disclosure relates in general to the field of integrated circuits. More specifically, the present disclosure relates to systems and methodologies for the testing of integrated circuit devices.

There is an increased desire for manufacturers, developers, and test organization to effectively test, characterize, and diagnose an integrated circuit (IC) more completely and at the lowest possible cost. One method of testing and characterizing is to use the Shmoo plot tool—a graphical representation of an IC's ability to operate properly in response to various combinations of values of various operating parameters. For example, one might repeatedly test an IC using different combinations of supply voltage and frequency to determine if the IC operates properly at those combinations and parameter ranges. This is typically mapped on a Shmoo plot. For example, the voltage can be on one axis of a scatter plot and the frequency can be on the other axis of the scatter plot. A test of the IC is done at each combination of voltage and frequency and the pass/fail status can be indicated on the shmoo plot.

A difficulty becomes evident when dealing with larger ICs such as VLSI chips known as systems on a chip (SOC) or complex multi-core processors with millions or even billions of transistors and heterogeneous circuits such as combinational logic, various types of memory, analog, and wireless RF. In such devices, the ability to adjust critical operating parameters, reconfigure the chip into separate regions, alter the data paths, and change test operations, might also be internal to the chip as an integral part of the chip design (in contrast to more traditional methods of controlling things like voltage, frequency, and chip test modes which can be controlled outside the IC). Strict external and limited internal test controls are not conducive to complex testing methodologies such as chip self-test and testing at application speeds and environmental conditions in various chip configurations.

SUMMARY

Embodiments are directed to an on-chip, computer-assisted test method. The method includes loading an on-chip test flow and control testing program for execution by a microcontroller within an integrated circuit chip to be tested. The microcontroller within the integrated circuit chip can then execute the testing program. The testing program can be dynamically self-adjusted based on the execution of the testing program.

Embodiments are further directed to a computer system. The system includes a memory, a processor system communicatively coupled to the memory, and an integrated circuit chip to be tested, the integrated circuit chip comprising an adaptive testing microcontroller. The adaptive testing microcontroller configured to perform a method comprising loading a testing program from an external traditional test system. The method can further comprise executing the testing program. The method also comprises dynamically adjusting the testing program based on the execution of the testing program. The method further comprises executing the adjusted testing program.

Embodiments are further directed to a computer program product. The computer program product includes a computer-readable storage medium having program instructions embodied therewith. The computer-readable storage medium is not a transitory signal per se. The program instructions readable by a processor system to cause the processor system to perform a method comprising loading a testing program from the test processor system. Thereafter executing the testing program. The method further comprises dynamically adjusting the testing program based on the execution of the testing program. The method further comprises executing the adjusted testing program.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

DETAILED DESCRIPTION

Figure 1:
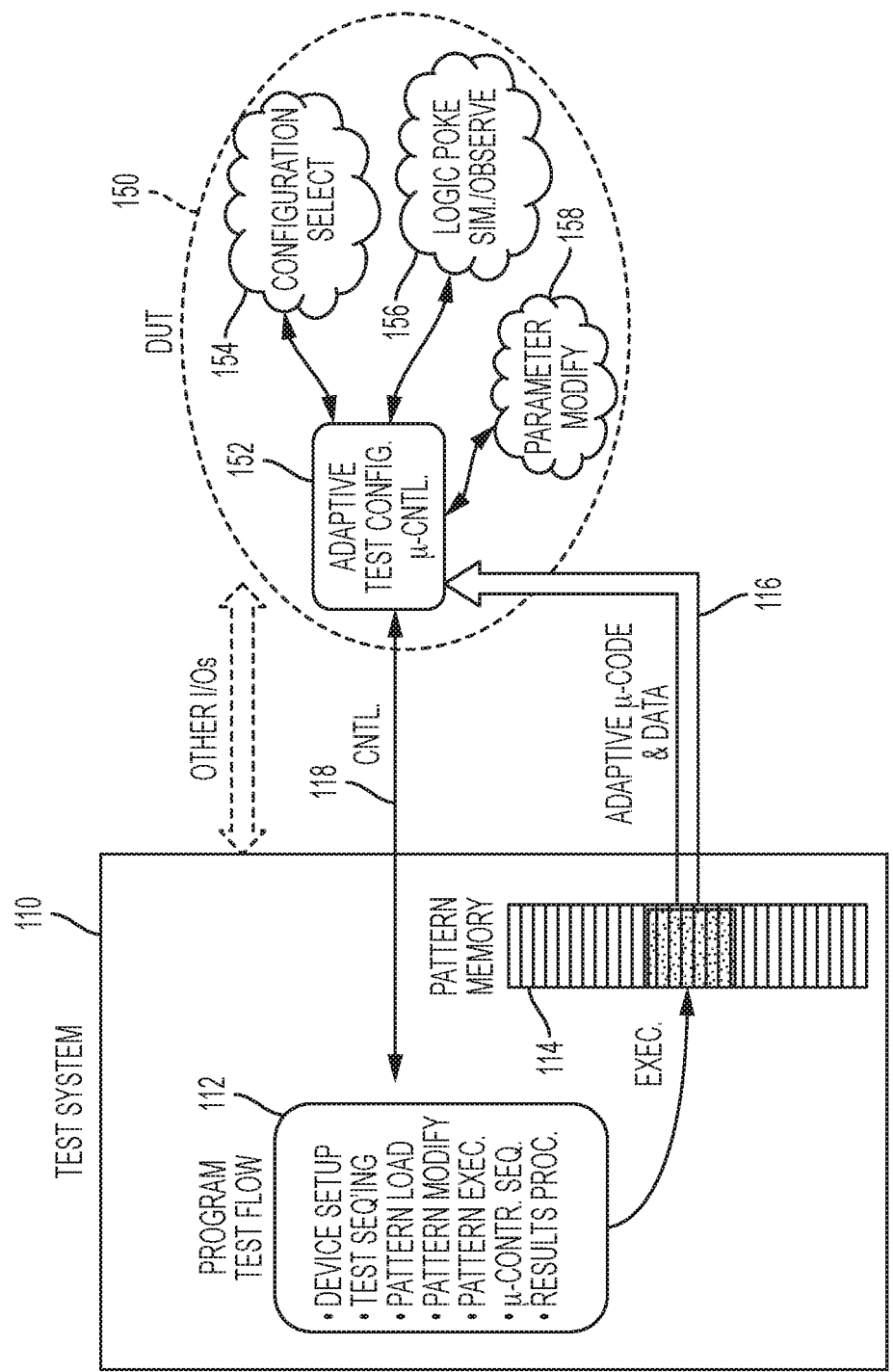
FIG. 1 depicts a block diagram presenting an overview of an embodiment.

Various embodiments of the present disclosure will now be described with reference to the related drawings. Alternate embodiments may be devised without departing from the scope of this disclosure. Various connections might be set forth between elements in the following description and in the drawings. These connections, unless specified otherwise, may be direct or indirect, and the present disclosure is not intended to be limiting in this respect. Accordingly, a coupling of entities may refer to either a direct or an indirect connection.

Additionally, although this disclosure includes a detailed description of a computing device configuration, implementation of the teachings recited herein are not limited to a particular type or configuration of computing device(s). Rather, embodiments of the present disclosure are capable of being implemented in conjunction with any other type or configuration of wireless or non-wireless computing devices and/or computing environments, now known or later developed.

At least the features and combinations of features described in the present application, including the corresponding features and combinations of features depicted in the figures, amount to significantly more than implementing a method of analyzing data in a particular technological environment. Additionally, at least the features and combinations of features described in the present application, including the corresponding features and combinations of features depicted in the figures, go beyond what is well-understood, routine and conventional in the relevant field(s).

As described above, creating a shmoo plot in the above-described manner (a process sometimes known as shmooing) might not be not a viable method of testing when sensitivity parameters or device reconfigurability cannot be changed by means that are external to a device being tested. This parameter controllability and observability problem can be a critical limitation to the current characterization and diagnostic techniques used in the testing of highly integrated ICs. In many of these VLSI devices, the critical parameters and reconfigurability are internal to the device. This can limit testing and the subsequent diagnosis of VLSI devices in the identification of multi-dimensional failing regions and the sensitivity and correlation of these failing regions to several test setup parameters. Typically, the failing regions are determined by shmooing two test variables at a time, such as frequency versus voltage, over an extended device operating range and localizing the failing region in the two-dimensional space of a shmoo plot. While this approach can be effective for some defects, it is not adaptive. Nor is the approach robust enough to identify small failing regions that are dependent on several variables due to more subtle defects. This approach also limits or even prevents effective characterization for the whole chip and/or its regions at operation speeds while dynamically reconfiguring a chip or adjusting parameters similar to what might happen during chip application operations in the field.

Identifying these diverse and subtle defects and pinpointing the root cause of the problem in a large logic structure typically uses high-resolution diagnostic calls to isolate any defects, and to successfully complete the physical failure analysis (PFA) defect localization and/or quickly find and fix early design problems during verification. The resolution of state-of-the-art logic diagnostic algorithms and techniques depend on the number of tests being conducted and the amount of passing and failing test result data available for each fault and/or design issue. Conventional methods of generating failures and collecting associated test results might be insufficient to achieve the desired diagnostic resolution. Further, reconfiguring and isolating other regions of a complex multi-core or SOC (system on a chip) design is necessary, by conventional methods, for effective characterization of good and bad chips.

Today's complex SOCs typically have additional on-chip support to adaptively and dynamically reconfigure the chip using techniques including, but not limited to, power fencing, clock gating, reconfigurable data paths, and bypassing memory and logic, all during the multidimensional parameter shmoo process. Due to the nature of these large and very complex design configurations and the parameter shmooing matrices, this novel diagnostic and characterization method using a design for test (DFT) microcontroller with diagnostic data storage is used to provide on-chip programmable and iterative diagnostic and characterization procedure that can be loaded on chip and work interactively with a traditional tester. Thus, today's large SOC design characterization and problem isolation is limited by large external characterization instrumentation typically on Automated Test Equipment (ATE) or bench test equipment.

Today's adaptive characterization and diagnostics is limited to chip scan loads to control chip configuration and other conditional parameters. Scan unloads might also be required to observe internal chip DFT monitoring and results registers. Complex SOCs continue to cause complex AC and subtle intermittent problems. Chip shmoo DFT is used to monitor and control chip configurations during shmoo and characterization.

Problem isolation sometimes requires dynamic chip reconfiguration such as changing clock speeds, enabling and disabling clocks, chip region select and deselect, bypassing regions such as memory, and adjusting internal DACs for voltage, timing, and the like. Dynamic, at-speed reconfiguration is typically performed during standard shmooing like voltage, timing, and temperature.

Embodiments disclosed herein propose the use of 'device-assisted' characterization and diagnostic method by integrating adaptive, at-speed reconfigurability, critical parameter control and observability, and on-chip data analytics within the device design. These dynamically adaptive built-in controls, in conjunction with interactive shmoo tools, result in effective characterization & diagnostic methods applicable to functional and structural testing.

Embodiments presented herein provide on-chip DFT shmooing logic which executes a built-in self-test circuit or shmoo instruments and dynamically alters the test circuit or shmoo conditions based on the real-time results recorded during testing. Traditionally, the conditions and chip configurations have been varied through external control or scan loads. In the alternative, a predefined set of test conditions could be programmed into an on-chip controller. What is disclosed here is a built-in method which dynamically adjusts the circuit instruments or shmoo based on results of the test. Items including, but not limited to on-chip scan configuration, chip clock skew, voltage regulators, voltage pumps, level shifters, OCCG (On Chip Clock Generators) and PLLs (Phase Lock Loops), timing circuits, elastic I/O DLLs (Chip Input/Output Driver & Receiver Delay Lock Loops) along with their associated controllers can be adjusted based on any test or shmoo response. Other DFT logic, such as noise generators, jitter generators, and thermal heaters, can also be deployed to modulate and simulate system environments during functional operation to help diagnose product Accepted Quality Level field fails. These can be either complex fault test escapes or reliability life failures in the system. These types of fails can be particularly difficult to repeat due to lack of a real system environment running complex system instructions at varying chip and system conditions. Hence, embodiments presented herein can adapt based on the real-time results as well as many chip parameters enabling a very complex multi-dimensional test or shmoo closer to the failing conditions.

For this process, "done" will be defined differently depending on the goal of the analysis. If the goal is diagnostic, the analysis will iterate until the conditions which excite the fail are clearly understood. Conditions being tested can include voltage, temperature, timing, chip configuration, and many other parameters. If the goal is characterization then the analysis continues until the operating range of the product operational space is clearly understood.

An on-chip test-assist microcontroller is programmed with a pre-determined characterization test or diagnostics flow or shmoo and characterization flow. The microcontroller has access to all of the SOC DFT controls to dynamically and adaptively adjust on-chip timing, voltage, clock, configuration registers, and many other chip configuration characteristics. A shmoo or sequential set of tests can be performed by controlling all of these parameters at chip speeds during dead cycles or cycle sharing. Large amounts of data can be stored in an on-chip test results memory, which can be immediately analyzed by an on-chip analytics processor. The analytics processor can be pre-programmed to perform adaptive and conditional shmoos and/or change characterization flows, parameters, and configurations based on the analyzed results.

With reference to FIG. 1, a block diagram presenting an overview of an embodiment is presented. FIG. 1 illustrates a test system 110 that can be used to test a device under test ("DUT") 150. Test system 110 is coupled to device under test 150 via data lines 116 and control lines 118. Within test system 110 is a program test flow 112 that can contain the information and parameters that will be used to test device under test 150. The information and parameters that will be used for testing include, but are not limited to, device setup, test sequencing, pattern load, pattern modification, pattern execution, microcontroller sequencing information, and results processing.

Test system 110 can also include a pattern memory 114. Program test flow 112 can be loaded into pattern memory 114. In addition, program test flow 112 is coupled to device under test 150 via control lines 118. Pattern memory 114 is coupled to device under test 150 via data lines 116. Device under test 150 includes a microcontroller 152. Device under test 150 also has several additional modules, including configuration select 154, logic poke registers, logic stimulation, and observation of results 156, and parameter modify 158. The operation of the system shown in FIG. 1 is described in greater detail below in FIG. 2.

Figure 2:
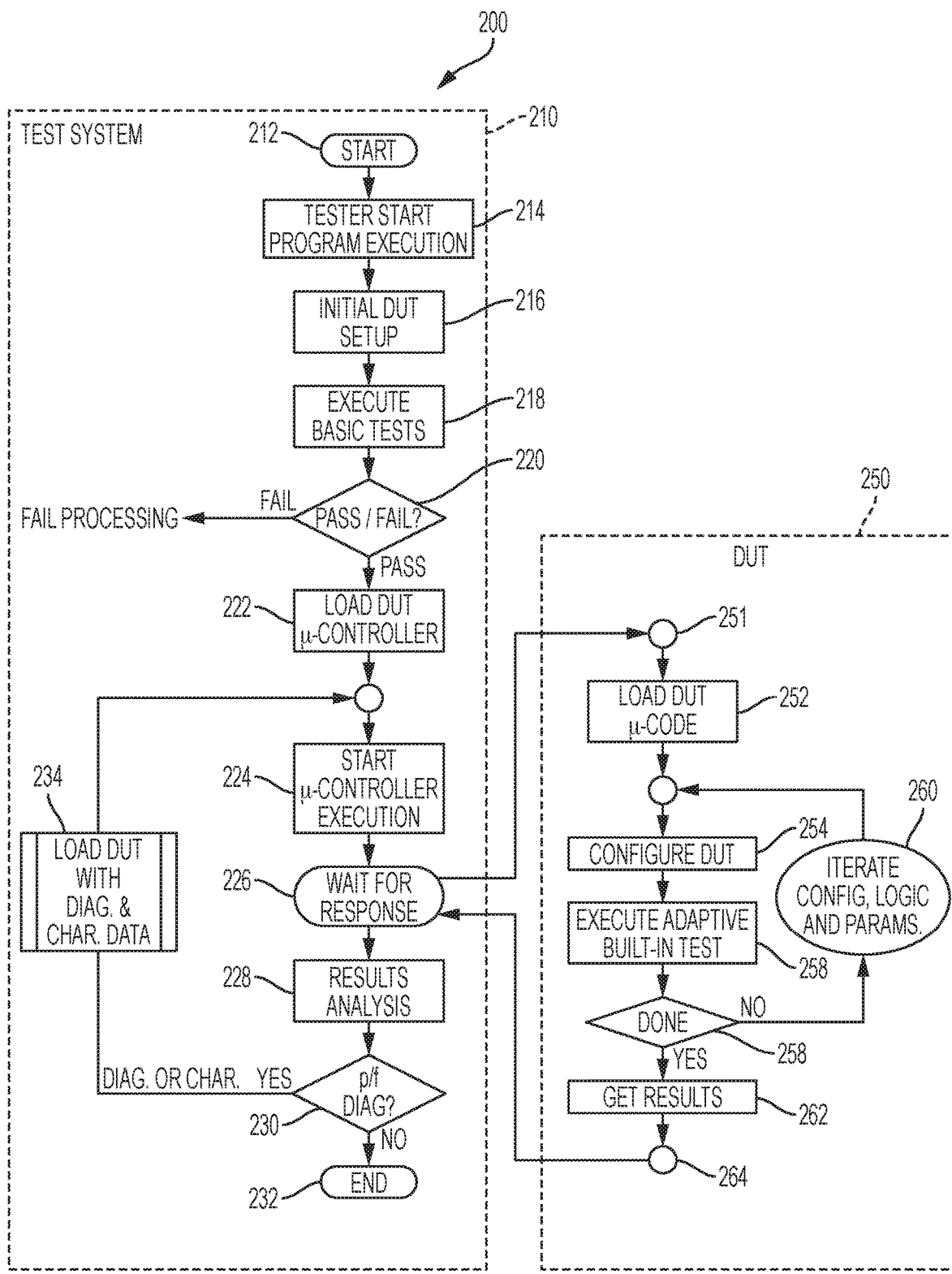
FIG. 2 depicts a flow diagram illustrating the operation of an embodiment.

A flowchart illustrating a method 200 is presented in FIG. 2. Method 200 is merely exemplary and is not limited to the embodiments presented herein. Method 200 can be employed in many different embodiments or examples not specifically depicted or described herein. In some embodiments, the procedures, processes, and/or activities of method 200 can be performed in the order presented. In other embodiments, the procedures, processes, and/or activities of method 200 can be performed in any other suitable order. In still other embodiments, one or more of the procedures, processes, and/or activities of method 200 can be combined with additional steps or skipped. The blocks located within block 210 can be executed by test system 110. The blocks located within block 250 can be executed by device under test 150.

The process starts at block 212. The test system begins program execution (block 214). The initial setup of the device under test is performed (block 216). Basic tests are then performed (block 218). Basic tests can include the operation at various timings, voltages, and temperatures on a subset of patterns to first verify the chip is mostly defect free and able to load and run a test program and verify that the DFT features are all working properly. If the basic tests fail, the device under test is marked as a failure and appropriate actions are taken on the device (block 220). For example, a failed device can be recycled or otherwise prevented from being further tested, characterized or released. In some cases, tests will continue for yield learning to diagnose fails to root cause and Failure Analysis (FA).

If the device under test passes the basic test, the microcontroller of the device under test is loaded with a program test flow (block 222) then the microcontroller begins execution of the loaded program test flow for a more complex set of tests and characterization procedures (block 224).

At the device under test, the program test flow is loaded into the microcontroller (block 252). The device under test is configured (block 254). Thereafter, the program test flow, containing an adaptive built-in test, is executed (block 256). The parameters in the program test flow can change aspects or parts of the device under test that are not typically accessible by external testers. These can include, but are not limited to, on-chip scan configuration, chip or core region select, test type, on chip BIST engine selection and BIST programs or patterns, chip clock skew, voltage regulators, voltage pumps, level shifters, OCG (On Chip Clock Generators) and PLLs (Phase Lock Loops), timing circuits, elastic I/O DLLs (Chip Input/Output Driver & Receiver Delay Lock Loops), and partial-good repairs and redundancy selections.

Once the built-in test containing the initial set of parameters is executed, it is checked to see if the test is done (block 258). If not, then another iteration of configuration and logic parameters is loaded (block 260) and operation resumes at block 254. Otherwise, control returns to the test system. A key aspect of some embodiments is that a second iteration from block 260 can be dynamically selected based on results from a first adaptive test. Then a third iteration from block 260 can be dynamically selected based on results from the first and second adaptive tests and so on. This continues until the desired result is reached or the on chip test program is exhausted. Additional test programs can also be loaded to start more on chip test flow passes until a desired result is completed.

At the test system, the results are analyzed (block 228). It is determined if the device under test passed or failed the diagnostics (block 230). If further diagnostics are needed, then the device under test is loaded with further diagnostic and characterization data (block 234) and the method resumes at block 224. Otherwise, the test ends (block 232).

Figure 3:
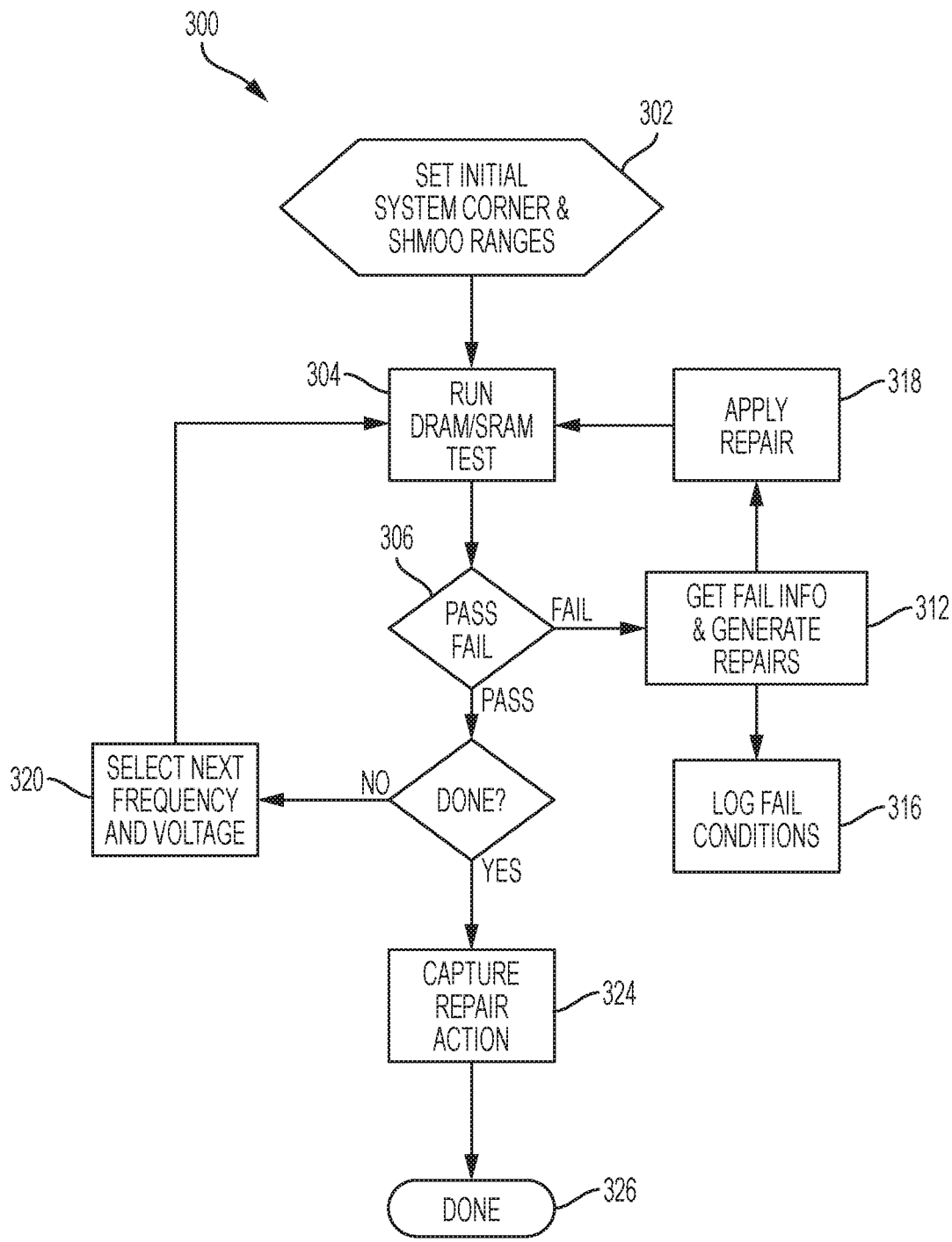
FIG. 3 depicts a flow diagram illustrating the operation of an embodiment in testing a memory chip.

What follows are a few examples of the use of an embodiment in testing various chips. A flowchart illustrating a method 300 is presented in FIG. 3. Method 300 is merely exemplary and is not limited to the embodiments presented herein. Method 300 can be employed in many different embodiments or examples not specifically depicted or described herein. In some embodiments, the procedures, processes, and/or activities of method 300 can be performed in the order presented. In other embodiments, the procedures, processes, and/or activities of method 300 can be performed in any other suitable order. In still other embodiments, one or more of the procedures, processes, and/or activities of method 300 can be combined or skipped.

Method 300 illustrates the operation of an embodiment when testing a memory chip or embedded memory within an SOC. The initial system configuration information is set (block 302). The test is begun, using the configuration information (block 304). It is determined if the memory passed the test (block 306). If the memory did not pass, then the failure information is gathered (block 312). The failure conditions are noted in a log (block 316) and a repair is made (block 318). Operation then resumes at block 304, with the memory being tested again.

If the memory or a sub-memory array passes or fails, it is determined if there are other configurations (such as other voltages, frequencies, memory physical configurations and the like are to be tested (block 320). Other configurations may encompass modifying internally generated voltage sources by modifying Digital-to-Analog Converters (DACs) settings. If there are other configurations to be tested, the new configuration, including other frequencies and voltages, is selected and loaded into the tester (block 322). Thereafter, operation resumes at block 304. If there are no other configurations to be tested, then any repair actions are implemented (block 324) and the first test operation is complete (block 326). After repair, memory testing may resume to verify the repair(s) and may continue to further test the memory to more complex memory disturb, retention, or AC tests until the memory performs to product like applications and at speed conditions for a full memory characterization and analysis.

Figure 4:
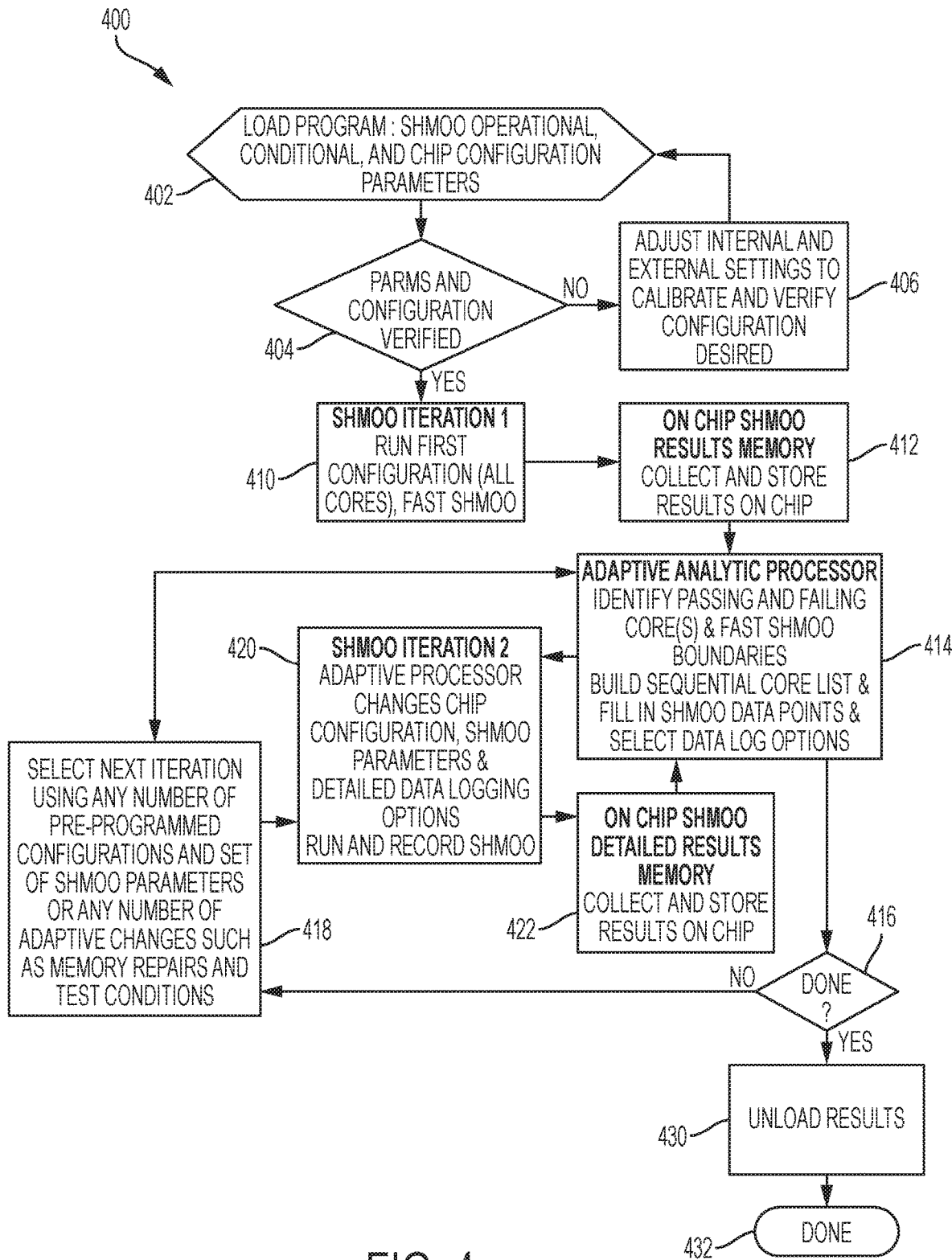
FIG. 4 depicts a flow diagram illustrating the operation of an embodiment in testing a chip.

A flowchart illustrating a method 400 is presented in FIG. 4. Method 400 is merely exemplary and is not limited to the embodiments presented herein. Method 400 can be employed in many different embodiments or examples not specifically depicted or described herein. In some embodiments, the procedures, processes, and/or activities of method 400 can be performed in the order presented. In other embodiments, the procedures, processes, and/or activities of method 400 can be performed in any other suitable order. In still other embodiments, one or more of the procedures, processes, and/or activities of method 400 can be combined or skipped.

Method 400 illustrates the use of an embodiment when testing a chip that can be controlled by both on-chip and off-chip instruments. A test program containing operational and conditional parameters is loaded onto the chip, which can be controlled by both off-chip and on-chip instruments (block 402). Operational parameters might include test time controls that run cores or other chip regions of the DUT in parallel or sequentially. Other operational parameters could include programmable sensor controls that control, measure, and store on-chip temperature, on-chip clock frequency, and various voltage domains during the testing process. The parameters and configuration can then be verified (block 404). Options might be made available for on-chip calibration test. Additionally, a test shutdown can occur if the programmed conditions like on-chip temperature, frequency, and voltage are not met or preliminary test instrumentation checks fail. At block 406, the setup conditions and measured settings information can then be unloaded and evaluated to readjust any external tester and internal chip controls before an on-chip testing is restarted. Once all the conditions are satisfied, the first iteration is allowed to start (block 410).

The first iteration can run a variety of tests and shmoos on the entire chip including logic regions, cores, and nest or glue logic and memory for a set of standard pre-loaded conditions such as temperature, timing, voltage, steps, test limits, and the start/stop of each test or set of shmoo parameters. All the programmed steps or start and stop boundaries can also be sampled for a very fast first iteration with results stored in an on-chip results memory (block 412).

Results are stored and analyzed by an adaptive analytics processor. The first iteration summary is analyzed in an on-chip analytics processor and then adapted to run any number of pre-programmed test options and chip configurations to collect more detailed information (block 414). This can also be a pre-programmed adaptive or conditional diagnostic for good and bad chip characterization.

At block 414, the analytical processor may also provide the microcontroller instructions or conditional decisions to adapt the test flow or select any core or another chip region, as well as the shmoo and test program conditions and additional test data points to run. An adaptive and conditional test flow, test sequence, and test ranges can also be pre-programmed. Other items, such as logic, memory, or both, may also be selected or bypassed. Different test paths might also be selected. The analytical processor can analyze results and make cognitive decisions to redirect the adaptive test microcontroller for more testing based on the results.

At block 416, it is determined if the testing is done. If not, then method 400 proceeds with block 418, where the next iteration is selected using any number of pre-programmed configurations and set of shmoo parameters or any number of adaptive changes such as memory repairs and test conditions. In addition, the analytical processor may also be pre-programmed to collect more detailed information using additional data log parameters. Information can be collected by logging the chip by region or recording results in on-chip memory by pass/fail, fails only, or by fail count. Also, logging by fail types or by failing addresses or any other detailed points in a test or shmoo. At block 420, new configuration register values are set and another iteration is run.

The second iteration results can be stored in the on-chip and/or off-chip memory and a preloaded adapted test or shmoo can continue or end. The second pass summary of fails can be stored in a separate detailed memory partition to preserve the first pass data (block 422). The first and/or second pass results can then be re-evaluated by the analytical processor at block 414. This can then be run for any number of iterations to adapt and run any number of programmed test and shmoo options. Objectives such as altering any condition or shmoo operation can be achieved to collect more detailed information on any chip region, processor core, analog circuit, RF circuit, or memory. A third iteration (or any subsequent iteration) also can be run. As an example, tasks such as deselecting failing or passing cores or chip regions and then restarting the same previously executed shmoo can be performed. Other tasks, such as repairing logic, input/output circuits, and memory, and running the tests or shmoo again also can be performed in subsequent iterations. When testing is considered done, the results are unloaded (block 430) and method 400 ends (block 432).

Figure 5:
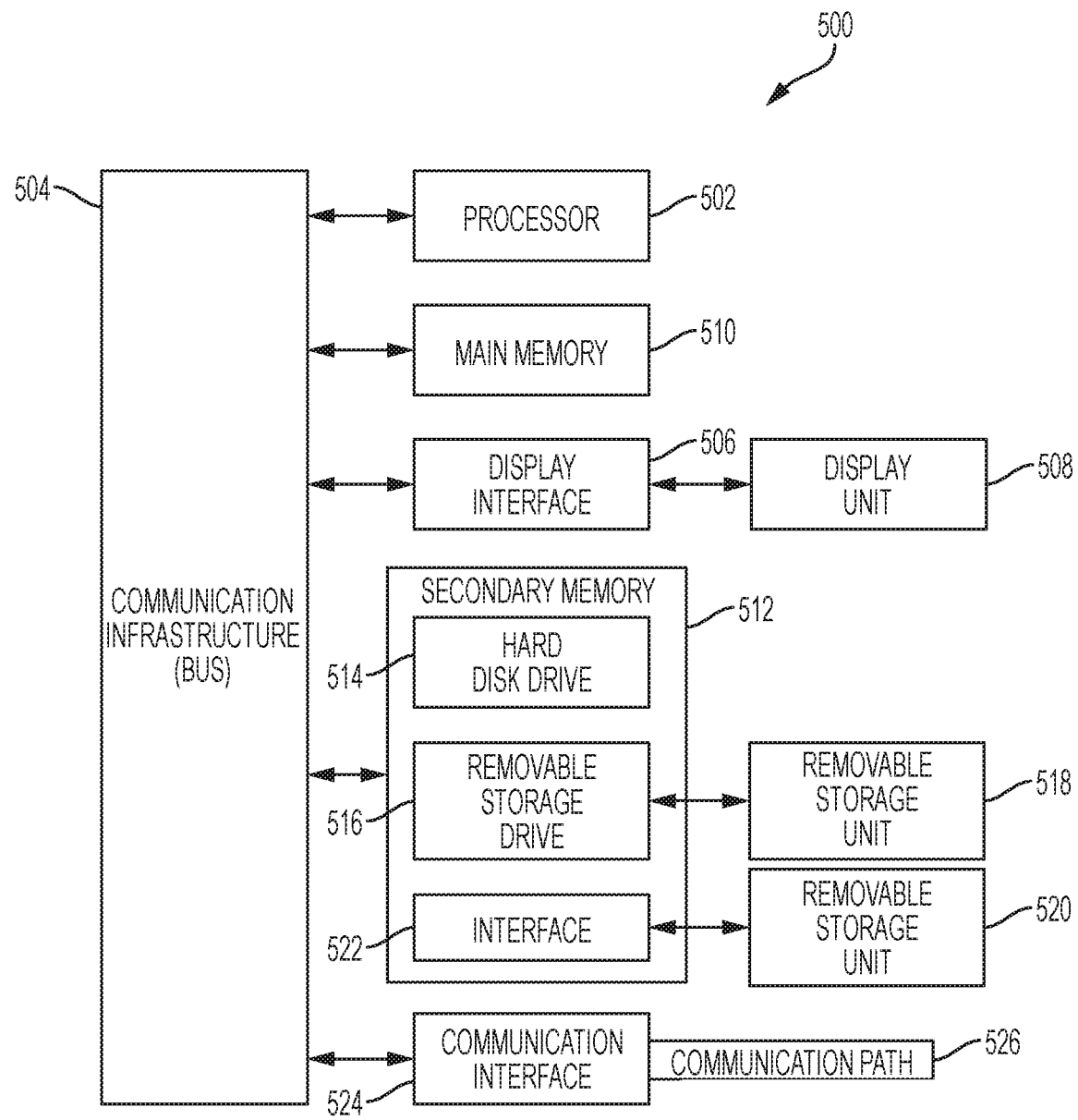
FIG. 5 depicts a computer system capable of implementing hardware components of one or more embodiments.

FIG. 5 depicts a high level block diagram computer system 500, which may be used to implement one or more embodiments of the present disclosure. More specifically, computer system 500 may be used to implement hardware components of systems capable of performing methods described herein. Although one exemplary computer system 500 is shown, computer system 500 includes a communication path 526, which connects computer system 500 to additional systems (not depicted) and may include one or more wide area networks (WANs) and/or local area networks (LANs) such as the Internet, intranet(s), and/or wireless communication network(s). Computer system 500 and additional system are in communication via communication path 526, e.g., to communicate data between them.

Computer system 500 includes one or more processors, such as processor 502. Processor 502 is connected to a communication infrastructure 504 (e.g., a communications bus, cross-over bar, or network). Computer system 500 can include a display interface 506 that forwards graphics, textual content, and other data from communication infrastructure 504 (or from a frame buffer not shown) for display on a display unit 508. Computer system 500 also includes a main memory 510, preferably random access memory (RAM), and may also include a secondary memory 512. Secondary memory 512 may include, for example, a hard disk drive 514 and/or a removable storage drive 516, representing, for example, a floppy disk drive, a magnetic tape drive, or an optical disc drive. Hard disk drive 514 can be in the form of a solid state drive (SSD), a traditional magnetic disk drive, or a hybrid of the two. There also may be more than one hard disk drive 514 contained within secondary memory 512. Removable storage drive 516 reads from and/or writes to a removable storage unit 518 in a manner well known to those having ordinary skill in the art. Removable storage unit 518 represents, for example, a floppy disk, a compact disc, a magnetic tape, or an optical disc, etc. which is read by and written to by removable storage drive 516. As will be appreciated, removable storage unit 518 includes a computer-readable medium having stored therein computer software and/or data.

In alternative embodiments, secondary memory 512 may include other similar means for allowing computer programs or other instructions to be loaded into the computer system. Such means may include, for example, a removable storage unit 520 and an interface 522. Examples of such means may include a program package and package interface (such as that found in video game devices), a removable memory chip (such as an EPROM, secure digital card (SD card), compact flash card (CF card), universal serial bus (USB) memory, or PROM) and associated socket, and other removable storage units 520 and interfaces 522 which allow software and data to be transferred from the removable storage unit 520 to computer system 500.

Computer system 500 may also include a communications interface 524. Communications interface 524 allows software and data to be transferred between the computer system and external devices. Examples of communications interface 524 may include a modem, a network interface (such as an Ethernet card), a communications port, or a PC card slot and card, a universal serial bus port (USB), and the like. Software and data transferred via communications interface 524 are in the form of signals which may be, for example, electronic, electromagnetic, optical, or other signals capable of being received by communications interface 524. These signals are provided to communications interface 524 via communication path (i.e., channel) 526. Communication path 526 carries signals and may be implemented using wire or cable, fiber optics, a phone line, a cellular phone link, an RF link, and/or other communications channels.

In the present disclosure, the terms "computer program medium," "computer usable medium," and "computer-readable medium" are used to generally refer to media such as main memory 510 and secondary memory 512, removable storage drive 516, and a hard disk installed in hard disk drive 514. Computer programs (also called computer control logic) are stored in main memory 510 and/or secondary memory 512. Computer programs may also be received via communications interface 524. Such computer programs, when run, enable the computer system to perform the features of the present disclosure as discussed herein. In particular, the computer programs, when run, enable processor 502 to perform the features of the computer system. Accordingly, such computer programs represent controllers of the computer system. Thus it can be seen from the forgoing detailed description that one or more embodiments of the present disclosure provide technical benefits and advantages.

Figure 6:
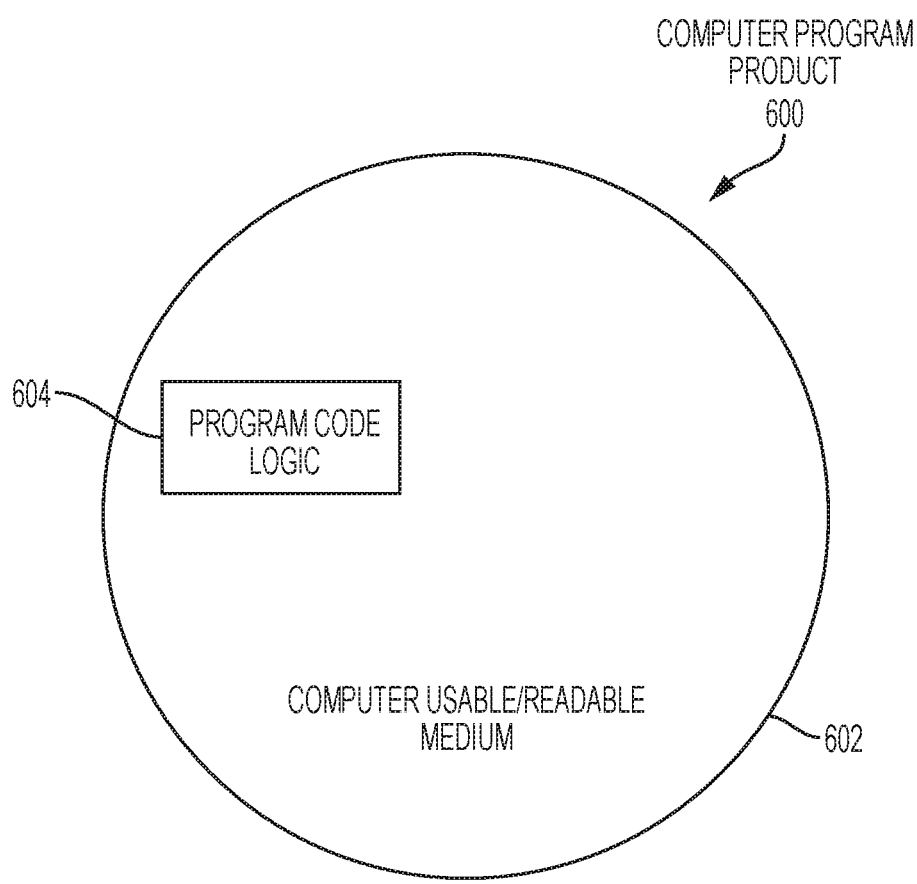
FIG. 6 depicts a diagram of a computer program product according to one or more embodiments.

Referring now to FIG. 6, a computer program product 600 in accordance with an embodiment that includes a computer-readable storage medium 602 and program instructions 604 is generally shown.

The present disclosure may be a system, a method, and/or a computer program product. The computer program product may include a computer-readable storage medium (or media) having computer-readable program instructions thereon for causing a processor to carry out aspects of the present disclosure.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may include assembler instructions, instruction-set-architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages, such as the "C" programming language or similar programming languages. The computer-readable program instructions may execute entirely on the entity's computer, partly on the entity's computer, as a stand-alone software package, partly on the entity's computer and partly on a remote computer or entirely on the remote computer or server. In the latter scenario, the remote computer may be connected to the entity's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the present disclosure. It will be understood that each block of the flowchart illustrations and/or block diagrams, and combinations of blocks in the flowchart illustrations and/or block diagrams, can be implemented by computer-readable program instructions.

These computer-readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
loading an on-chip test flow and control testing program for execution by a microcontroller within a device under test;
causing the microcontroller within the device under test to execute the testing program, wherein the testing program is arranged to adjust one or more of any of the following parameters of the device under test: on-chip scan configuration, chip clock skew, voltage regulators, voltage pumps, level shifters, partial-good configurations, redundancy selections, OCCG (On Chip Clock Generators), PLLs (Phase Lock Loops), timing circuits, and elastic I/O DLLs (Chip Input/Output Driver & Receiver Delay Lock Loops;
receiving, by the microcontroller within the device under test, results from the testing program;
dynamically adjusting, by the microcontroller within the device under test, the testing program based on the results of the testing program, wherein dynamically adjusting the testing program comprises adjusting one or more of the following parameters of the device under test that are not accessible by external testers: on-chip scan configuration, chip clock skew, voltage regulators, voltage pumps, level shifters, partial-good configurations, redundancy selections, OCG (On Chip Clock Generators), PLLs (Phase Lock Loops), timing circuits, and elastic I/O DLLs (Chip Input/Output Driver & Receiver Delay Lock Loops) and wherein dynamically adjusting the testing program based on the results of the testing program comprises determining that a desired result was not achieved by the results of the testing program; and
causing the microcontroller within the device under test to execute the adjusted testing program.

2. The method of claim 1 further comprising:
storing the results from the testing program in a test results memory located on the device under test.

3. The method of claim 1 further comprising:
causing a self-repair of the device under test upon detection of a problem with the device under test.

4. The method of claim 1 further comprising:
creating a shmoo plot based on results of the testing program.

5. The method of claim 1 further comprising:
identifying portions of the device under test for further testing based on results of the testing program; and wherein:
dynamically adjusting the testing program comprises adjusting the testing program to test the identified portions of the device under test.

6. A system comprising:
a memory;
a processor system communicatively coupled to the memory;
a device under test, the device under test comprising an adaptive testing microcontroller;

the adaptive testing microcontroller configured to perform a method comprising:

loading a testing program from the processor system;

executing the testing program, wherein the testing program is arranged to adjust one or more of the following parameters of the device under test: on-chip scan configuration, chip clock skew, voltage regulators, voltage pumps, level shifters, OCCG (On Chip Clock Generators), PLLs (Phase Lock Loops), timing circuits, and elastic I/O DLLs (Chip Input/Output Driver & Receiver Delay Lock Loops);

receiving, by the microcontroller within the device under test, results from the testing program;

wherein dynamically adjusting the testing program comprises adjusting one or more of the following parameters of the device under test that are not accessible by external testers: on-chip scan configuration, chip clock skew, voltage regulators, voltage pumps, level shifters, OCCG (On Chip Clock Generators), PLLs (Phase Lock Loops), timing circuits, and elastic I/O DLLs (Chip Input/Output Driver & Receiver Delay Lock Loops) and wherein dynamically adjusting the testing program based on the results of the testing program comprises determining that a desired result was not achieved by the results of the testing program; and executing the adjusted testing program.

7. The system of claim 6 further comprising:
storing the results from the testing program in a results memory located on the device under test.

8. The system of claim 6 further comprising:
causing a self-repair of the device under test upon detection of a problem with the device under test.

9. The system of claim 6 further comprising:
an analytical processor configured to analyze results of the execution of the testing program;
wherein the analytical processor is further configured to make cognitive decisions to redirect the adaptive testing microcontroller for more testing based on the results.

10. The system of claim 6 further comprising:
identifying portions of the device under test for further testing based on results of the testing program; and
wherein:
dynamically adjusting the testing program comprises adjusting the testing program to test the identified portions of the device under test.

11. A computer program product comprising:
a computer-readable storage medium having program instructions embodied therewith, wherein the computer-readable storage medium is not a transitory signal, the program instructions readable by a processor system to cause the processor system to perform a method comprising:

loading a testing program from the processor system for execution by a microcontroller within a device under test;

executing, by the microcontroller within the device under test, the testing program, wherein the testing program is arranged to adjust one or more of the following parameters of the device under test: on-chip scan configuration, chip clock skew, voltage regulators, voltage pumps, level shifters, partial-good configurations, redundancy selections, OCG (On Chip Clock Generators), PLLs (Phase Lock Loops), timing circuits, and elastic I/O DLLs (Chip Input/Output Driver & Receiver Delay Lock Loops);

receiving results from the testing program;

dynamically adjusting, by the microcontroller within the device under test, the testing program based on the results of the testing program, wherein dynamically adjusting the testing program comprises adjusting one or more of the following parameters of the device under test that are not accessible by external testers: on-chip scan configuration, chip clock skew, voltage regulators, voltage pumps, level shifters, partial-good configurations, redundancy selections, OCG (On Chip Clock Generators), PLLs (Phase Lock Loops), timing circuits, and elastic I/O DLLs (Chip Input/Output Driver & Receiver Delay Lock Loops) and wherein dynamically adjusting the testing program based on the results of the testing program comprises determining that a desired result was not achieved by the results of the testing program; and executing the adjusted testing program.

12. The computer program product of claim 11 further comprising:
causing a self-repair of the device under test upon detection of a problem with the device under test.

13. The computer program product of claim 11 further comprising:
creating a shmoo plot based on results of the testing program.

14. The computer program product of claim 11 further comprising:
identifying portions of the device under test for further testing based on results of the testing program; and
wherein:
dynamically adjusting the testing program comprises adjusting the testing program to test the identified portions of the device under test.

15. The method of claim 1, wherein the device under test comprises an integrated circuit chip.

16. The system of claim 6, wherein the device under test comprises an integrated circuit chip.

17. The computer program product of claim 11, wherein the device under test comprises an integrated circuit chip.

\* \* \* \* \*